(12) United States Patent
Krishnan et al.

(10) Patent No.: US 8,194,715 B2
(45) Date of Patent: Jun. 5, 2012

(54) APPARATUS AND METHOD FOR GENERATING A MONOCYCLE

(75) Inventors: Sivanand Krishnan, Singapore (SG); Kumar Vasudevan Pillai, Singapore (SG); Pankaj Sharma, Singapore (SG); Ohnmar Kyaw, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 1174 days.

(21) Appl. No.: 11/918,933

(22) PCT Filed: Apr. 20, 2005

(86) PCT No.: PCT/SG2005/000128
§ 371 (c)(1),
(2), (4) Date: Oct. 19, 2007

(87) PCT Pub. No.: WO2006/112792
PCT Pub. Date: Oct. 26, 2006

(65) Prior Publication Data
US 2009/0080493 A1 Mar. 26, 2009

(51) Int. Cl.
*H04B 1/00* (2006.01)
(52) U.S. Cl. ........ 375/130; 375/146; 375/219; 375/257; 375/259; 375/295; 327/100; 327/165; 327/335; 455/91
(58) Field of Classification Search .................. 375/130, 375/219, 256, 257, 259, 295, 146; 327/100, 327/165, 335; 455/91
See application file for complete search history.

(56) References Cited

U.S. PATENT DOCUMENTS

| | | | |
|---|---|---|---|
| 3,622,808 A | 11/1971 | Uchida | |
| 4,442,362 A | 4/1984 | Rao | |
| 5,420,589 A | 5/1995 | Wells et al. | |
| 6,026,125 A * | 2/2000 | Larrick et al. | 375/295 |
| 2007/0190953 A1* | 8/2007 | Tan Eng Choon et al. | 455/127.1 |

FOREIGN PATENT DOCUMENTS
WO WO91/13370 A1 9/1991

OTHER PUBLICATIONS

Jeongwoo Han et al "A New Ultra-Wideband, Ultra-Short Monocycle Pulse Generator With Reduced Ringing" IEEE 2002.*
Jeongwoo Han et al "Ultra-Wideband Electronically Tunable Pulse Generators" IEEE 2004.*
International Search Report, mailed Jun. 2, 2005, from International Application No. PCT/SG2005/000128, 4 pp.
Written Opinion of the International Searching Authority, mailed Jun. 2, 2006, from International Application No. PCT/SG2005/000128, 4 pp.

(Continued)

*Primary Examiner* — Leon Flores
(74) *Attorney, Agent, or Firm* — Weaver Austin Villeneuve & Sampson LLP

(57) ABSTRACT

An apparatus for generating a monocycle comprises an input signal source (76) for providing an input signal, and a step recovery diode (SRD) (80) for receiving the input signal and producing an impulse. A shunt inductor (102) is provided to act as a first differentiator and a capacitor (92) connected in series to the output of the step recovery diode acts as a second differentiator. The first and second differentiators are arranged to double differentiate the impulse to produce a monocycle.

45 Claims, 9 Drawing Sheets

OTHER PUBLICATIONS

International Preliminary Report on Patentability, issued Oct. 23, 2007, mailed Nov. 1, 2007, from International Application No. PCT/SG2005/000128, 2 pp.

International Search Report, mailed Jun. 2, 2005, from International Application No. PCT/SG2005/000128, 2 pp.

Lee, Leong Soo, et al. (Jun. 2001) "New Uniplanar Subnanosecond Monocycle Pulse Generator and Transformer for Time-Domain Microwave Applications", IEEE Transactions on Microwave Theory and Techniques, vol. 49, No. 6, Jun. 2001, pp. 1126-1129.

Lee, Jeong Soo, et al. (May 2001) "Novel Low-Cost Ultra-Wideband, Ultra-Short-Pulse Transmitter with MESFET Impulse-Shaping Circuitry for Reduced Distortion and Improved Pulse Repetition Rate", IEEE Microwave and Wireless Components Letters, vol. 11, No. 5, May 2001, pp. 208-210.

* cited by examiner

---PRIOR ART---

---PRIOR ART---

---PRIOR ART---

---PRIOR ART---

FIGURE 5
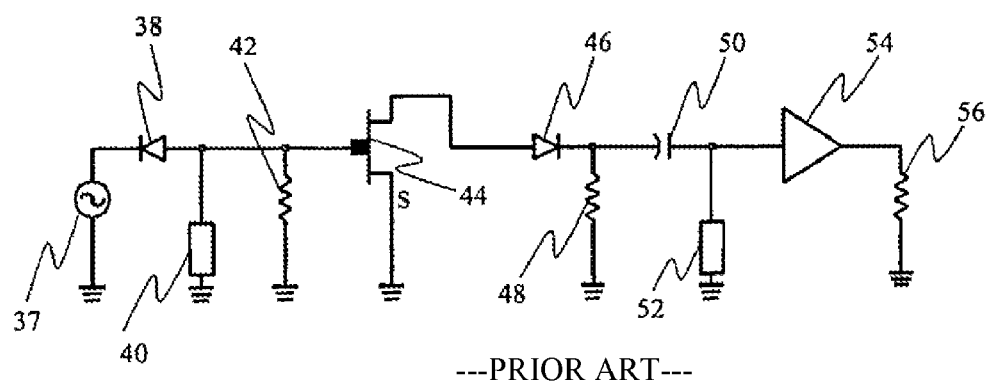
---PRIOR ART---
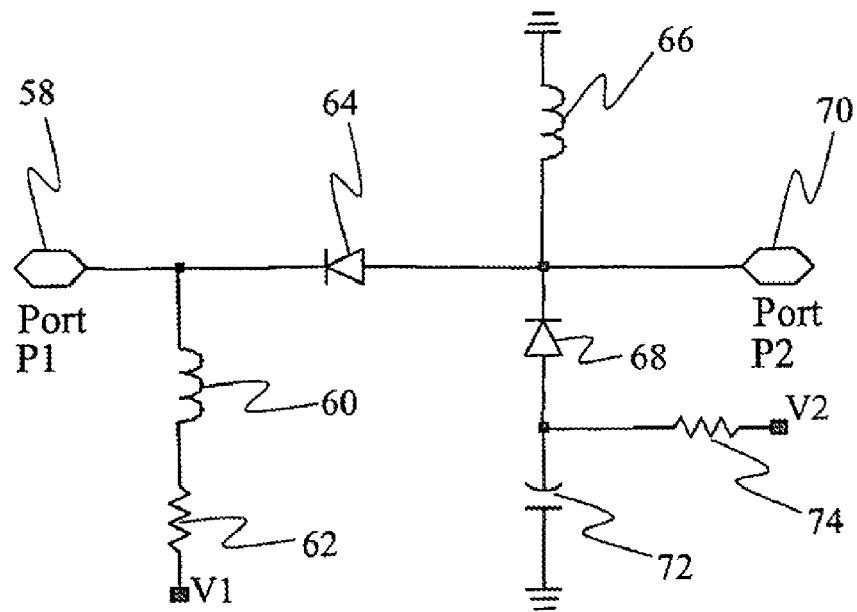
FIGURE 6          ---PRIOR ART---

APPARATUS AND METHOD FOR GENERATING A MONOCYCLE

FIELD OF THE INVENTION

The present invention relates to apparatus and methods for generating a monocycle, for use, for example, in Ultra Wideband (UWB) systems.

BACKGROUND OF THE INVENTION

Ultra Wideband (UWB) technology, which is useful for both communication and sensing applications, is based on very short pulses and time domain signal processing. A very commonly used pulse in UWB systems is the monocycle and as the monocycle's width determines the bandwidth, a narrow pulse width is necessary for producing an ultra wideband signal.

There are several methods of generating pulses and devices used for pulse generation include, for example, tunnel diodes, avalanche transistors, and step recovery diodes (SRDs). In Ultra Wideband (UWB) applications, each pulse may represent a symbol. In a typical UWB application, the pulses are followed by a silence period (a space). The characteristics of the pulse are changed to represent the data.

FIG. 1 shows conventional pulse position modulation where the position of the pulse is either advanced or delayed from its mean position to represent a symbol. FIG. 2 shows conventional bi-phase modulation of the pulse to represent the symbol. In FIGS. 1 and 2, the distance between the peaks of the waveforms represents the pulse repetition period.

For high data rate applications, it is imperative that the pulse width is low to permit more pulses to be transmitted in a given period. If only one cycle of a pulse is generated, the energy may be spread over a wide frequency band. Also, the data rate may be improved as the silence period is larger and so more pulses may be transmitted, for a given duty cycle, by multiplexing other channels.

One conventional way of generating very narrow pulses is to use Step Recovery Diodes (SRDs).

Although there are many fast square wave pulse generators commercially available, there are few high speed monocycle generators.

Monocycles may be generated by twice differentiating the rising edge and falling edge of square pulses using differentiators or Impulse Forming Networks. This is described in the Impulse Forming Networks Data Sheet of Picosecond Pulse Labs. This document describes the use of the differentiation of fast rise time signals to generate pulses. Differentiation of the leading edge produces a positive impulse and differentiation of a trailing edge produces a negative impulse. One more differentiation produces a monocycle. Whilst passive resistor and capacitor elements may be used for the differentiation, the amplitude and the pulse width of the resultant monocycle depends, to a large extent, on the rise time and the fall time of the signal.

There are a number of further problems with this approach. Firstly, circuits for generating signals with fast rising edges with rise times of the order of tens of picoseconds are needed and such circuits or commercial instruments are generally expensive and not economical for low cost applications. Secondly, for every monocycle generated by the rising edge, a 180 degrees phase shifted monocycle would be generated by the falling edge. This reduces the flexibility of this approach. Thus the generation of sub-nanosecond monocycle pulses with pulse repetition rates of up to 1 GHz using low cost circuitry is very desirable. Most conventional monocycle generators use lumped elements instead of distributed elements and thus are more expensive and less repeatable due to component tolerances.

A number of alternative conventional monocycle generators use several active devices in the circuit. For example, in the system described in the document by Jeong Soo Lee, Cam Nguyen and Tom Scullion entitled "New Uniplanar Subnanosecond Monocycle Pulse Generator and Transformer for Time-Domain Microwave Applications", June 2001 IEEE Transactions On Microwave Theory And Techniques, Vol. 49, No. 6, pp 1126-1129, Step Recovery Diodes (SRDs) are used together with Schottky diodes for generating very narrow pulses. The Schottky diode is included to overcome the ringing effect which tends otherwise to be exhibited as narrower monocycles and higher pulse repetition rates are attempted in systems using SRD circuits for generating sub-nanosecond monocycles.

The method described in the document by Jeong Soo Lee, Cam Nguyen and Tom Scullion in the document entitled "New Uniplanar Subnanosecond Monocycle Pulse Generator and Transformer for Time-Domain Microwave Applications", June 2001 IEEE Transactions On Microwave Theory And Techniques, Vol. 49, No. 6, pp 1126-1129, combines two Gaussian pulses to produce a monocycle. The two Gaussian pulses are 180 degrees out of phase and have a time delay between them.

FIG. 3 shows the circuit for generating a monocycle according to the above mentioned publication by Jeong Soo Lee, Cam Nguyen and Tom Scullion. The circuit is driven by a local oscillator 1 which supplies 10 MHz square wave signal to the anode of an SRD diode 2. The cathode of the SRD diode is connected to a 50 Ohm short circuited transmission line 3 and to the anode of a Schottky diode 4. The cathode of the Schottky diode 4 is connected to a capacitor 6 and to a resistor 8. The resistor 8 is earthed. The capacitor 6 is connected to two further transmission lines 10, 12, one of which is terminated 12 and the other of which is short circuited 10.

This method has the disadvantage of wider pulse width, as the width of the monocycle is twice the impulse width. Furthermore, the use of Schottky diodes to limit the ringing effect adds to the cost of the pulse generator.

The document by Jeong Soo Lee, Cam Nguyen and Tom Scullion in the document entitled "New Uniplanar Subnanosecond Monocycle Pulse Generator and Transformer for Time-Domain Microwave Applications", June 2001 IEEE Transactions On Microwave Theory And Techniques, Vol. 49, No. 6, pp 1126-1129, also describes a pulse-to-monocycle converter. This differs from the circuit described above in that the SRD 2 is omitted, together with the short circuited transmission line 3. However, the converter requires a narrow pulse to drive it instead of a square wave and it is not itself a pulse generator.

In another prior art document, entitled "A New Ultra-Wideband, Ultra-Short Monocycle Pulse Generator With Reduced Ringing", Jeongwoo Han and Cam Nguyen, June 2002, IEEE Microwave And Wireless Components Letters, Vol. 12, No. 6, pp 206-208, a system is described and which is illustrated in FIG. 4. The circuit includes a square wave generator 14 which is connected to the anode of an SRD 16. The cathode of the SRD is connected to a short circuited transmission line 18 and also to the anode of a Schottky diode 20. The cathode of the Schottky diode is connected to a terminated transmission line 22 and to a capacitor 24. The output of the capacitor 24 is connected to the cathode of a further Schottky diode 26, the anode of which is earthed. The output of the capacitor 24 is also connected to a resistor 28 and to a further capacitor 30, the output of which is earthed by a further resistor 32. The output of the resistor 28 is connected, via a further capacitor 34, to ground. A voltage source 36 is connected across the capacitor 34. The SRD 16 produces a Gaussian pulse and the resistor 32 and capacitor 30 form a high pass filter which acts as a differentiator to convert the Gaussian pulse into a monocycle. The width of the monocycle formed after differentiation of the Gaussian pulse is almost the same as that of the pulse itself. The two Schottky diodes 20 and 26 act to reduce the ringing effect. The main disadvantage associated with this system is the use of the Schottky diodes, which adds to the cost of the system.

In Jeong Soo Lee and Cam Nguyen, "Novel Low-cost Ultra-Wideband, Ultra-Short-Pulse Transmitter with MESFET Impulse-Shaping Circuitry for Reduced Distortion and Improved Pulse Repetition Rate", May 2001, IEEE Microwave And Wireless Components Letters, Vol. 11, No. 5, pp 208-210, a system is described which includes, as shown in FIG. 5, a generator 37 connected to the cathode of an SRD 38, the anode of which is connected to a short circuited transmission line 40. The anode of the SRD 38 is also connected to an earthed resistor 42 and to the gate of a MESFET 44. The source of the MESFET 44 is earthed. The drain of the MESFET 44 is connected to the anode of a Schottky diode 46. The cathode of the Schottky diode 46 is connected to an earthed resistor 48 and also to a capacitor 50. The output of the capacitor 50 is connected to a short circuited transmission line 52 and to the input of an MMIC amplifier 54. The output of the MMIC amplifier 54 is terminated in a resistor 56 which is connected to ground. The MESFET 44 is used as an impulse-shaping network and it enables the circuit to achieve higher pulse repetition frequencies of up to several hundreds of mega Hertz. However, the use of the MESFET 44, and the Schottky diode 46 add to the cost of the system.

U.S. Pat. No. 4,442,362 describes a short pulse generator using an SRD. A plurality of capacitors are charged in parallel and then connected in series by a plurality of avalanche transistors to obtain a voltage which is substantially equal to the sum of the capacitor voltages when charged. The series coupled capacitors are then coupled, via an output avalanche transistor, to a differentiator which produces a monocycle pulse. This method can generate high peak amplitude pulses. However, the use of the avalanche transistors adds to the cost of the system making it too expensive for low cost systems. Also, the use of avalanche transistors limits the pulse repetition rate.

U.S. Pat. No. 3,622,808 describes a pulse shaping circuit for producing high frequency pulses using two step recovery diodes and other lumped components. The circuit is shown in FIG. 6. A signal source 58, for example, a sine wave, is connected to an inductance 60, the other end of which is connected via a resistor 62 to a voltage source (not shown). The signal source 58 is also connected to the cathode of an SRD 64. The anode of the SRD 64 is connected via a further inductor 66 to ground. The anode of the SRD 64 is also connected to the cathode of a further SRD 68 and to the output 70 of the system. The anode of the further SRD 68 is connected via a capacitor 72 to ground and via a resistor 74 to a further power supply (not shown). This system produces narrow pulses at high frequency but does not itself produce a monocycle. The main disadvantage of this system is the high cost of the system.

Thus, there is a need for a low cost monocycle generator preferably capable of generating sub-nanosecond monocycles with pulse repetition frequencies in excess of 1 GHz.

SUMMARY OF THE INVENTION

In general terms, the present invention proposes an apparatus and method for generating a monocycle comprising an SRD together with elements for pulse generation, the impulse generated being double differentiated to generate the monocycle. This is particularly advantageous as it makes the apparatus simple and cheap to use and easily reproduceable.

Furthermore, the methods of the present invention are easily performed and the apparatus embodying the present invention is easily created.

According to a first aspect of the present invention there is provided an apparatus for generating a monocycle comprising:
    an input signal source for providing an input signal;
    a step recovery diode (SRD) to receive said input signal and produce an impulse, said step recovery diode having an input and an output; and
    one or more differentiators arranged to double differentiate said impulse to produce a monocycle.

According to a second aspect of the present invention there is provided an Ultra Wideband system comprising the apparatus defined above.

According to a third aspect of the present invention there is provided a system for producing multi-band signals comprising the apparatus defined above, the apparatus having an output, the system further comprising one or more band pass filters having associated inputs and outputs, wherein the output of the apparatus is connected to the inputs of said one or more band pass filters, said system further comprising one or more modulators, each modulator having an associated output, said one or more modulators being arranged to modulate the outputs of the band pass filters, and said one or more modulators being arranged such that said outputs of said one or more modulators are combined to produce a multi-band ultra-wide band signal.

According to a fourth aspect of the present invention there is provided a method for generating a monocycle comprising:
    providing an input signal from an input signal source to a step recovery diode;
    producing an impulse using said step recovery diode;
    differentiating said impulse twice to produce a monocycle.

According to a fifth aspect of the present invention there is provided a method for producing multi-band signals comprising:
(a) generating a monocycle by:
    (i) providing an input signal from an input signal source to a step recovery diode;
    (ii) producing an impulse using said step recovery diode; and
    (iii) differentiating said impulse twice to produce a monocycle;
(b) applying said monocycle as an input to one or more band pass filters, said one or more band pass filters having one or more outputs;
(c) modulating said one or more outputs of said one or more band pass filters using one or more modulators to produce one or more modulated output signals; and
(d) combining said one or more modulated output signals to produce a multi-band ultra-wide band signal.

Preferred embodiments of the invention provide a very low cost solution for generating sub-nanosecond monocycles with pulse repetition frequencies in excess of around 1 GHz.

Preferred embodiments of the invention do not require expensive circuitry for generating fast rise/fall time pulses. Furthermore, as the component count in preferred embodiments of the invention is lower than in conventional monocycle generators, and preferably only a single active element (an SRD) is required, the apparatus embodying the invention is economical to use and produce.

BRIEF DESCRIPTION OF THE DRAWINGS

Preferred features of the invention will now be described, for the sake of illustration only, with reference to the following Figures in which:

FIG. 5 is a circuit diagram of a further alternative conventional system for producing monocycles;

FIG. 6 is a circuit diagram of a conventional pulse generator;

DETAILED DESCRIPTION OF PREFERRED EMBODIMENTS

FIGS. 1 to 6 show conventional circuits for producing monocycles and/or pulses and associated waveforms. These circuits have been described above in the Background of The Invention section.

The methods and devices which illustrate preferred embodiments of the invention will be explained with reference to FIGS. 7 to 23.

Preferred embodiments of the invention relate to the generation of narrow monocycles using step recovery diodes (SRDs). These monocycles are suitable for Ultra Wideband applications. Preferably, the embodiments of the invention make use of the reverse recovery phenomenon of the SRD to generate fast transitions, and preferably use distributed microstrip elements to generate very narrow monocycle pulses from these transitions.

The SRD has the ability to store charge and to change impedance levels very rapidly. During the forward biased condition, the SRD conducts and stores the charge. When the biasing changes from the forward biased condition to the reverse biased condition, the SRD conducts for a very short duration until the stored charge is removed, after which the diode no longer conducts. This transition from the conducting to the non-conducting state is extremely fast, in the range of a few tens of picoseconds.

Figure 1:
FIG. 1 is a waveform illustrating conventional pulse position modulation where the position of the pulse is either advanced or delayed from its mean position to represent a symbol.
Figure 2:
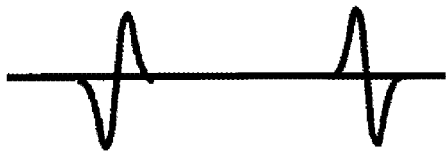
FIG. 2 is a waveform illustrating a conventional bi-phase modulation of a pulse to represent a symbol.
Figure 3:
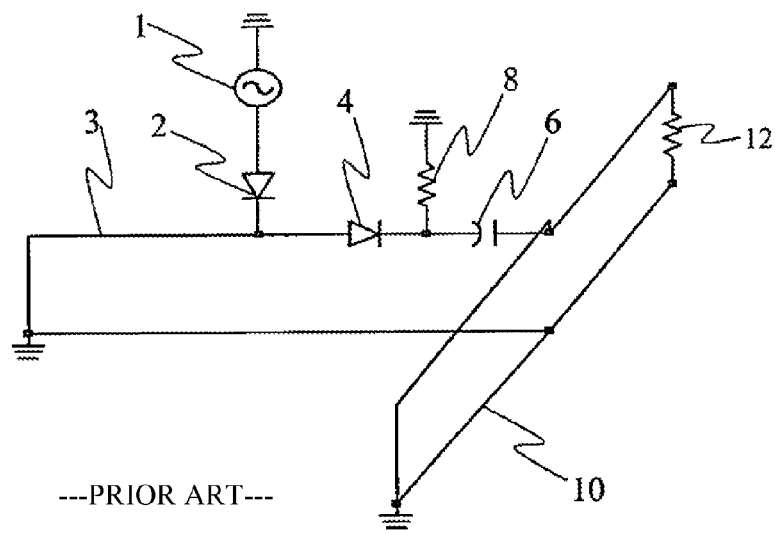
FIG. 3 is a circuit diagram of a conventional system for producing monocycles.
Figure 4:
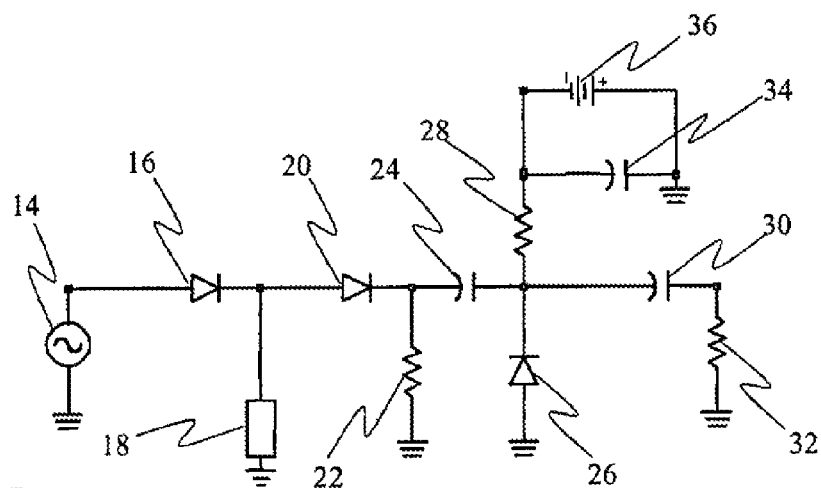
FIG. 4 is a circuit diagram an alternative conventional system for producing monocycles.
Figure 7:
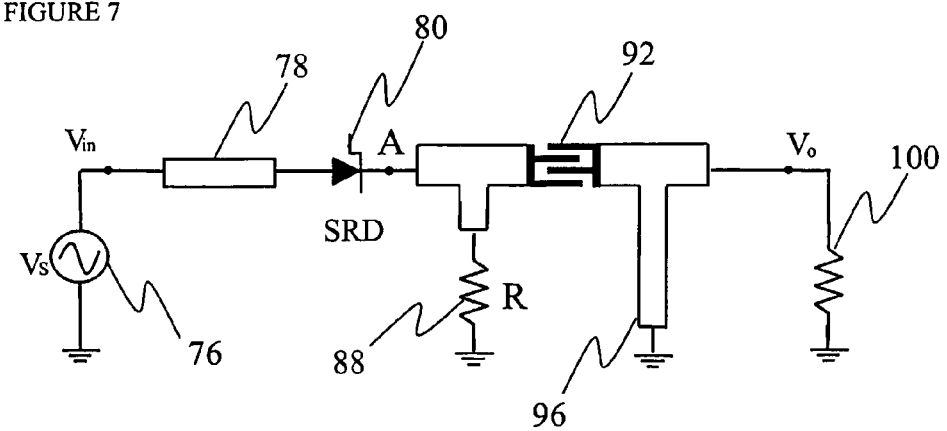
FIG. 7 is a circuit diagram of a system for producing monocycles according to a first embodiment of the present invention.

FIG. 7 is a schematic circuit diagram of a system according to a first preferred embodiment for generating narrow monocycles. The circuit makes use of resistive matching between an SRD and a pulse forming network comprising distributed Microstrip elements to reduce the ringing. An input signal source 76, which may be any form of bi-polar signal, for example a sine wave, a square wave or a pulse, is connected to a first transmission line 78, the output of which is connected to the anode of an SRD 80. The cathode of the SRD 80 is connected to a resistor 88 which is connected to ground. The cathode of the SRD 80 is also connected to a distributed capacitor 92, the output of which is connected to a short circuited transmission line 96 in the form of a distributed inductor and to a resistor 100. The distributed inductor 96 is also connected to ground.

In the circuit of FIG. 7, the SRD 80 generates a fast transition when the input signal changes the biasing of the SRD 80 from forward to reverse. The resistor 88 is used to provide resistive matching and helps to reduce ringing.

The resistor 88 also provides a DC path for the SRD 80. The short circuited transmission line 96 is used as an inductor and this transmission line and the distributed capacitor 92 act as differentiators. The resistor 100 represents the load resistance.

The output of the SRD 80 is fed to the pulse-forming network comprising the transmission line 96 and the capacitor 92 which each act as a differentiator to generate impulses and monocycles.

The output voltage of a differentiator is given by:

$$V_{out} = T \, dV_{in}/dt$$

where $V_{out}$ = the output of a differentiator $V_{in}$ = the input voltage, and T = the time derivative coefficient Thus, the differentiators convert the fast transition of the SRD output into a pulse. The rest of the SRD output after differentiation becomes negligible.

The system illustrated in FIG. 7 may generate highly symmetrical monocycles of widths less than around 300 ps with negligible ringing.

Figure 8A:
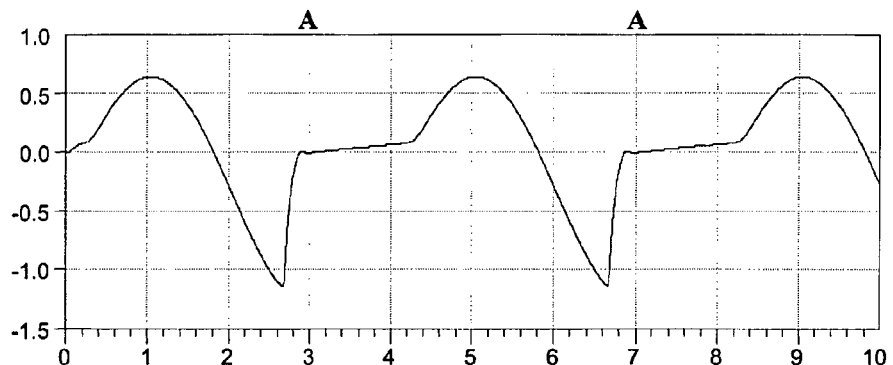
FIG. 8a is a waveform produced by the SRD of the circuit shown in FIG. 7.

The waveform at the output of the SRD 80 in the circuit of FIG. 7 is shown in FIG. 8a, the impulse being formed at a point A as shown in FIG. 8a.

Figure 8B:
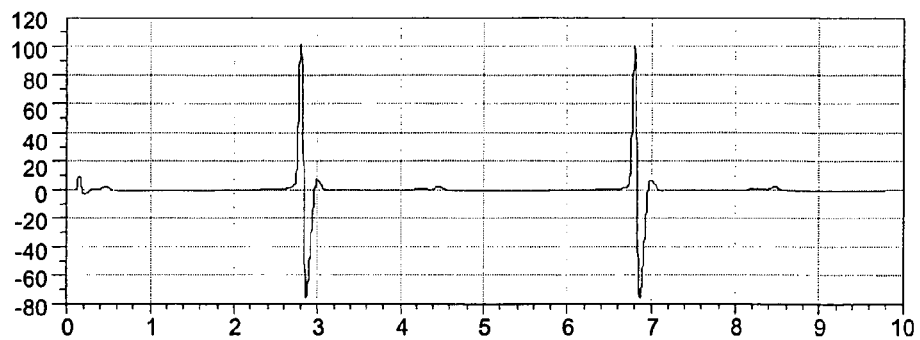
FIG. 8b is a simulated waveform showing output pulses produced by the circuit of FIG. 7.
Figure 9:
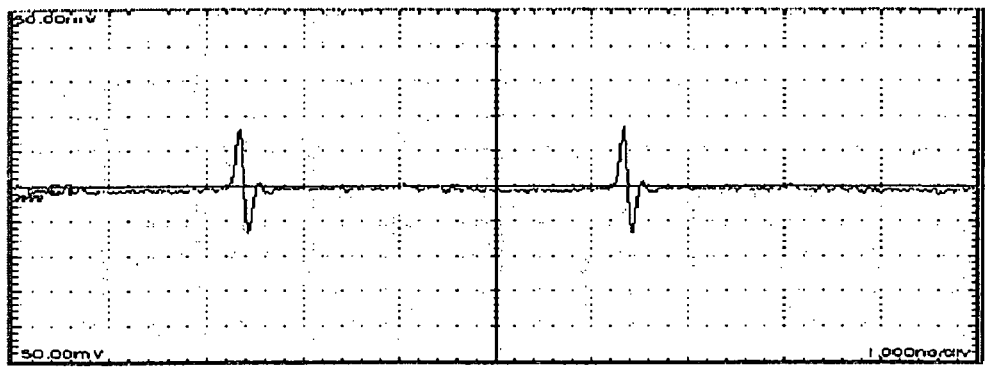
FIG. 9 is a measured waveform showing output pulses produced by the circuit of FIG. 7.

The circuit shown in FIG. 7 has been simulated using Agilent Technologies' Advanced Design Systems (ADS) and the pulse obtained after simulation is shown in FIG. 8b. The circuit was also fabricated and tested and the measured pulse is shown in FIG. 9. The monocycle pulse generator of FIG. 7 was fabricated on 32 mil Duroid substrate with a dielectric constant of 3.38. The SRD 80 used was MP4023 from M/s Mpulse Microwave. The measurement was made using a 50 GHz Digital Sampling Oscilloscope. It will be seen that the measured pulse obtained from the system of FIG. 7 has good symmetry on the positive and negative parts and has a width of 260 ps. The amount of ringing is very low and is acceptable for most practical systems. The pulse repetition rate of the monocycle shown in FIG. 9 is 250 MHz. It was found that the pulse generator is capable of generating monocycles at a repetition frequency in the range of around 10 MHz to around 1 GHz.

Figure 10:
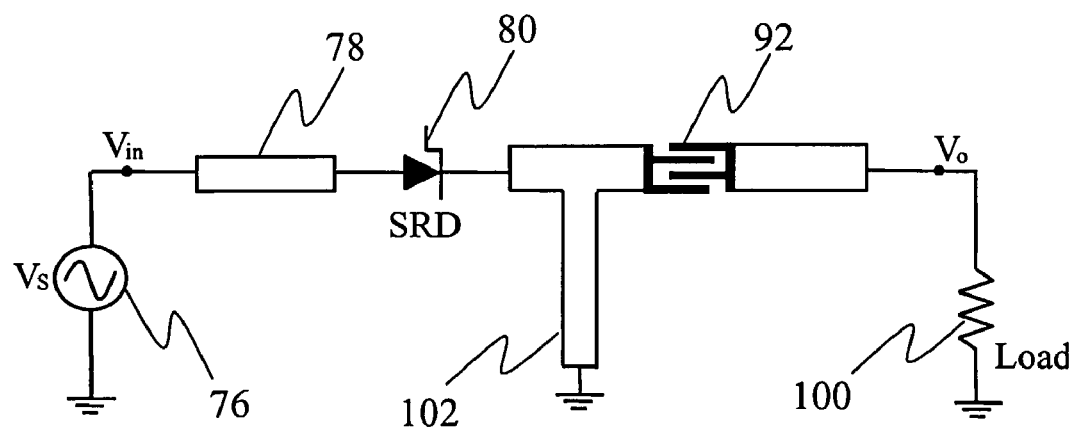
FIG. 10 is a circuit diagram of a system for producing monocycles according to a second embodiment of the present invention.

FIG. 10 is a schematic circuit diagram of a system according to a second preferred embodiment for generating narrow monocycles. The circuit of FIG. 10 differs from the circuit shown in FIG. 7 in that it omits the lumped passive resistor 88 and has a single SRD and distributed Microstrip elements.

The elements of the circuit illustrated in FIG. 10 which correspond exactly to elements in the circuit shown in FIG. 7 are allotted the same reference numerals.

The circuit of FIG. 10 comprises a signal source 76 connected to a first transmission line 78. The output of the first transmission line 78 is connected to the anode of an SRD 80 and the cathode of the SRD 80 is connected to a first terminal of a second transmission line 102 comprising a distributed inductor which is short circuited. The second terminal of the second transmission line 102 is connected to ground and acts as a DC return for the SRD 80. The cathode of the SRD 80 is also connected to a distributed capacitor 92 and the output of the capacitor 92 is terminated in a resistor 100. The other terminal of the resistor 100 is connected to ground.

In the circuit of FIG. 10, the monocycle generation begins with an impulse that is first formed by the SRD 80. This impulse is differentiated once by the second transmission line 102 which acts as a shunt inductor and the resultant pulse is differentiated again by the distributed capacitor 92. The waveform seen by the load (resistor 100) is thus a monocycle.

Figure 11:
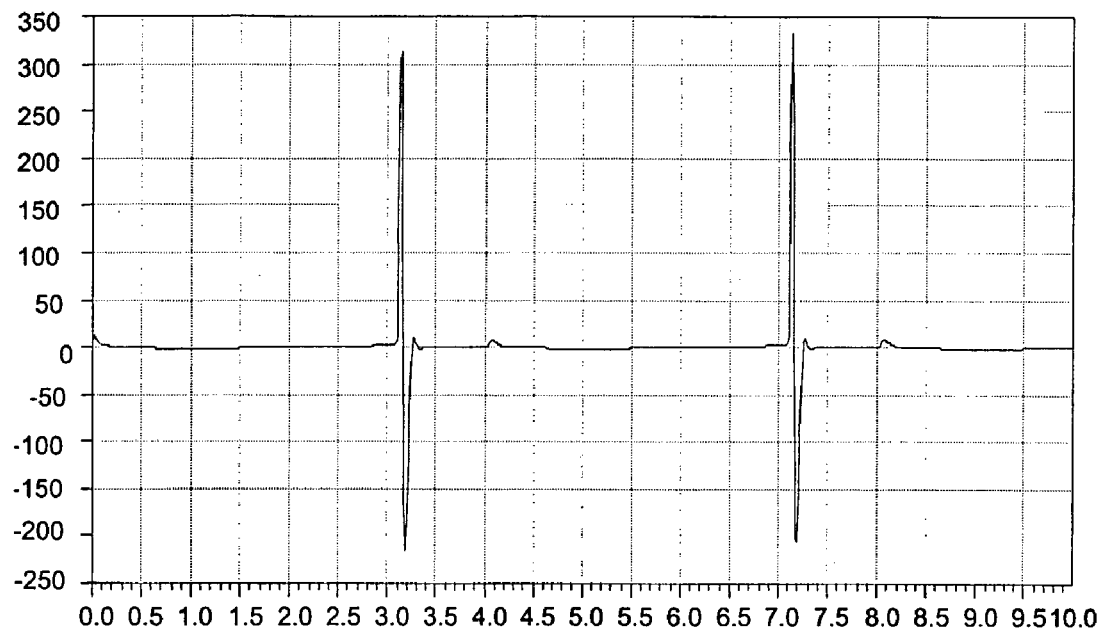
FIG. 11 is a simulated waveform showing output pulses produced by the circuit of FIG. 10.

The circuit of FIG. 10 was simulated using Agilent Technologies' ADS. The simulated result is shown in FIG. 11. The simulated pulse width was about 250 ps and the pulse repetition frequency was 250 MHz. However, the pulse repetition frequency may be increased to higher frequencies without affecting the performance. By changing the length of the second transmission line 102 which is acting as a shunt inductor, the inductance may be varied to adjust the shape of the monocycle. Thus, in the circuits of FIGS. 7 and 10, at least one transmission line is used as an inductor rather than a delay line, which is in contrast to prior art systems.

The circuit of FIG. 10 was also fabricated on 32 mil Duroid substrate with a dielectric constant of 3.38. The measurement result is shown in FIG. 12.

The pulse repetition frequency was 250 MHz and the measured pulse width was about 290 ps. It was found that the pulse generator 76 of FIG. 10 is capable of generating monocycles at a repetition frequency in excess of 1 GHz.

Figure 12:
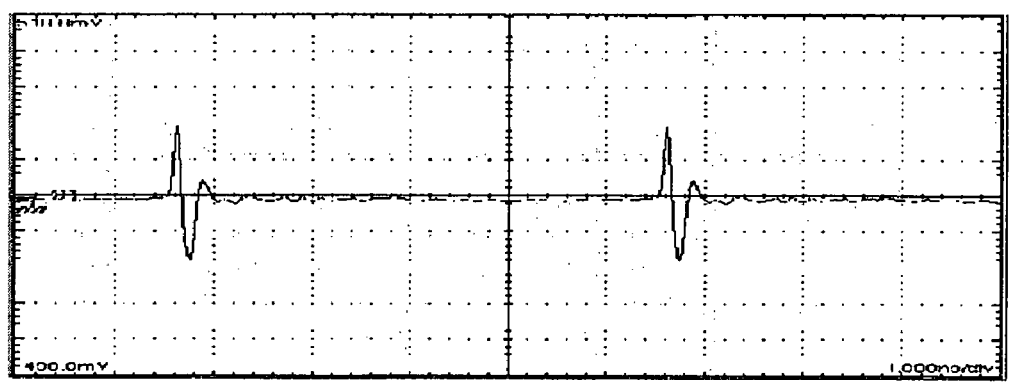
FIG. 12 is a measured waveform showing output pulses produced by the circuit of FIG. 10.

A comparison of the measured results shown in FIGS. 12 and 9 (which relate to the circuits of FIGS. 10 and 7 respectively), shows that there is a little additional ringing in the circuit of FIG. 10 due to the lack of a matching resistive element which is present in the circuit of FIG. 7. This leads to some degradation in performance. However, the circuit of FIG. 10 is a lower cost alternative to the circuit of FIG. 7 due to the use of purely distributed elements and may be used when the system requirements allow for a reduction in cost to be traded-off for a small amount of additional ringing. Despite the lack of resistive matching, the generated monocycle from the circuit of FIG. 10 is comparable to that of the circuit of FIG. 7.

Thus, the circuits of FIGS. 7 and 10 provide two low cost, high performance circuits for monocycle generation. The circuit of FIG. 7 provides very good performance whilst using two lumped elements in the circuit, namely an SRD and a shunt resistor. The circuit of FIG. 10 allows for an even lower cost implementation by using only one lumped element, an SRD, in return for a very small sacrifice in performance.

The circuits of FIGS. 7 and 10 may be used to achieve pulse repetition frequencies in excess of 1 GHz. The circuit of FIG. 7 may enable the generation of highly symmetrical monocycles of widths less than around 300 ps with negligible ringing. The circuit of FIG. 10 sacrifices a very small amount of performance in return for a cut in the cost of fabrication. The use of purely distributed components in the circuit of FIG. 10 also increases the repeatability in the performance of the circuit. This will be a major advantage in mass production.

Sub-nanosecond pulse width monocycle generators with the kind of high pulse repetition frequencies demonstrated by preferred embodiments of the invention are currently not available commercially. Furthermore, preferred embodiments of the invention may be fabricated using very low cost components. Also, preferred embodiments of the invention preferably do not make use of any other active device to reduce the ringing, unlike conventional systems.

Figure 13:
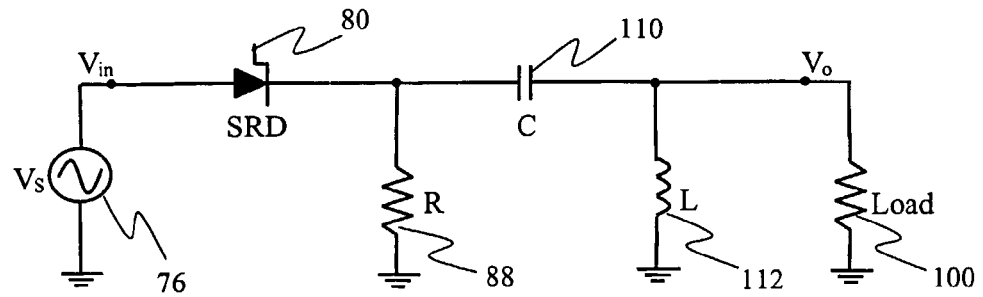
FIG. 13 is a circuit diagram of a system for producing monocycles according to a third embodiment of the present invention.

FIG. 13 is a schematic circuit diagram of a system according to a further preferred embodiment of the present invention. The circuit of FIG. 13 differs from the circuit of FIG. 7 in that the distributed capacitor 92 and distributed inductor 96 of the circuit of FIG. 7 are replaced with lumped passive elements in the form of a lumped capacitor 110 and a lumped inductor 112. The elements of the circuit illustrated in FIG. 13 which correspond exactly to elements in the circuit shown in FIG. 7 are allotted the same reference numerals.

The circuit of FIG. 13 comprises a signal source 76 connected to the anode of an SRD 80 and the cathode of the SRD 80 is connected to a first terminal of a resistor 88 which provides a DC path for the SRD 80. The other terminal of the resistor 88 is connected to ground. The cathode of the SRD 80 is also connected to the input of a lumped capacitor 110 and the output of the capacitor 110 is connected to a first terminal of a lumped inductor 112 and to a first terminal of a load resistor 100. The other terminal of the inductor 112 is connected to ground, as is the other terminal of the load resistor 100.

Figure 14:
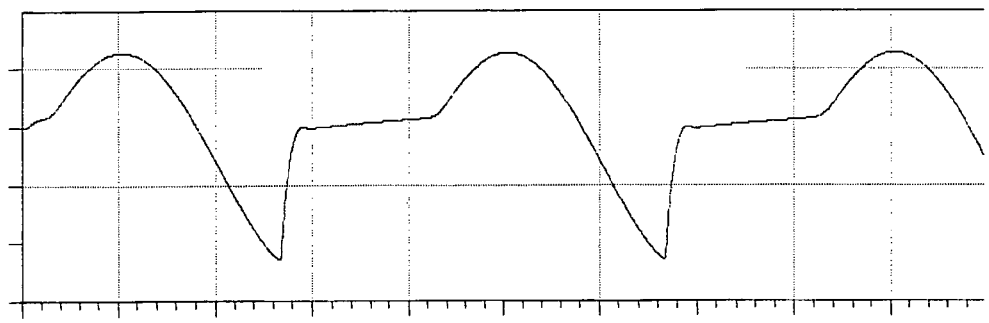
FIG. 14 is a waveform produced by the SRD in the circuit shown in FIG. 13.

In the circuit of FIG. 13, the monocycle generation begins with an impulse that is first formed by the SRD 80. This impulse is differentiated by a second order inductor capacitor differentiator comprising the capacitor 110 and the shunt inductor 112 to produce the monocycle. The waveform seen by the load resistor 100 is thus a monocycle. The waveform produced by the SRD 80 is shown in FIG. 14.

Figure 15:
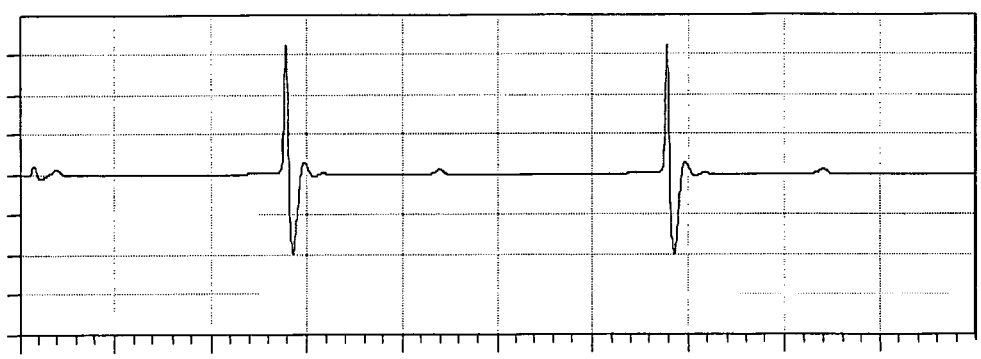
FIG. 15 is a simulated waveform showing output pulses produced by the circuit of FIG. 13.

The circuit of FIG. 13 was simulated using Agilent Technologies' ADS. The simulated result is shown in FIG. 15. The simulated pulse width was about 250 ps and the pulse repetition frequency was 250 MHz.

Figure 16:
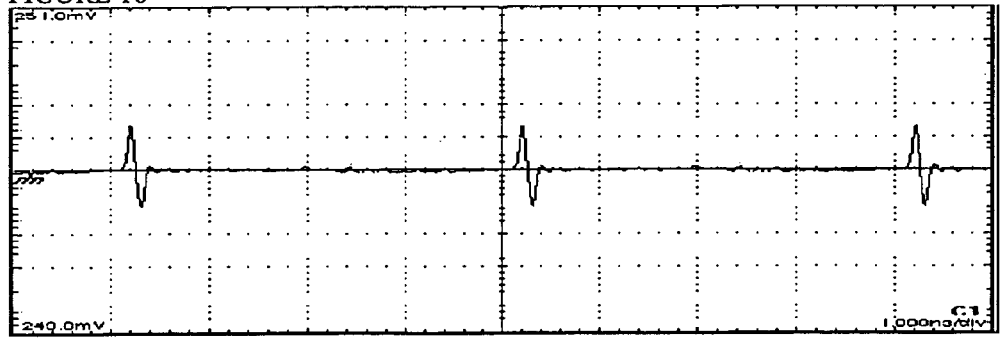
FIG. 16 is a measured waveform showing output pulses produced by the circuit of FIG. 13.

The circuit of FIG. 13 was also fabricated on 32 mil Duroid substrate with a dielectric constant of 3.38. The measurement result is shown in FIG. 16. The pulse repetition frequency was 250 MHz and the measured pulse width was about 290 ps.

Figure 17:
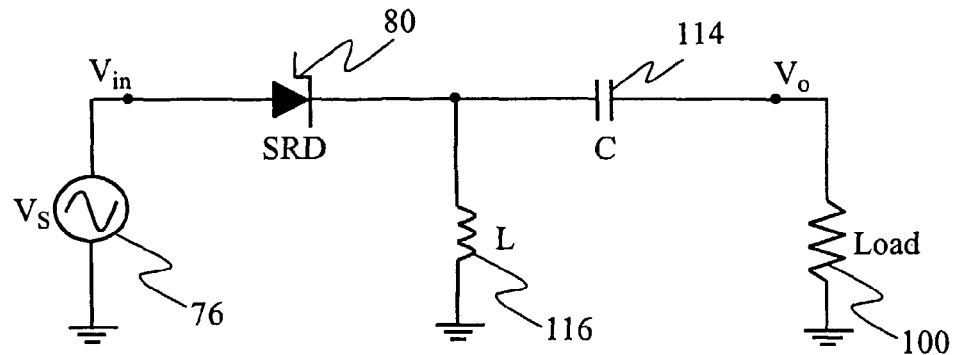
FIG. 17 is a circuit diagram of a system for producing monocycles according to a fourth embodiment of the present invention.

FIG. 17 is a schematic circuit diagram of a system according to a further preferred embodiment and is similar to the circuit of FIG. 10. However, in the circuit of FIG. 17, the distributed capacitor 92 of the circuit of FIG. 10 is replaced by a lumped capacitor 114 and a lumped shunt inductor 116 replaces the distributed inductor 102. The lumped shunt inductor 116 provides a DC return path for the SRD 80.

The circuit of FIG. 17 comprises a signal source 76 connected to the anode of an SRD 80, the cathode of which is connected to a first terminal of a lumped inductor 116 and the input of a lumped capacitor 114. The second terminal of the inductor 116 is connected to ground and the output of the capacitor 114 is connected to a load resistor 100, the other end of the resistor 100 being connected to ground.

In the circuit of FIG. 17, the SRD 80 generates a sharp voltage transition which is differentiated by a second order inductor-capacitor (L-C) differentiator comprising the capacitor 114 and the inductor 116, to produce a monocycle across the load resistor 100.

Figure 18:
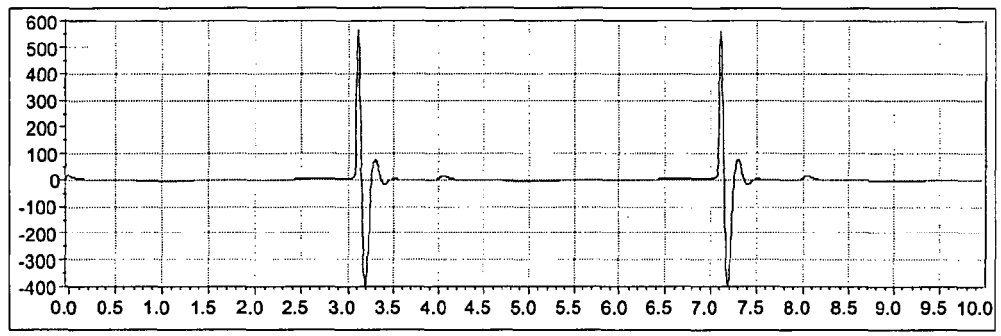
FIG. 18 is a simulated waveform showing output pulses produced by the circuit of FIG. 17.

The circuit of FIG. 17 was simulated using Agilent Technologies' ADS. The simulated result is shown in FIG. 18. Simulated pulse width was about 250 ps and the pulse repetition frequency was 250 MHz.

Figure 19:
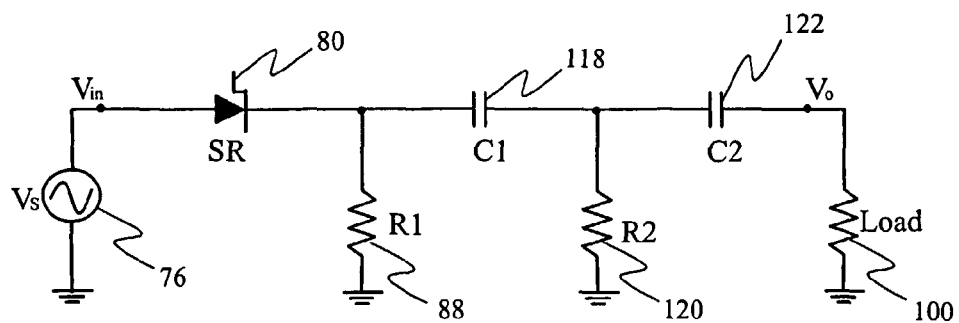
FIG. 19 is a circuit diagram of a system for producing monocycles according to a fifth embodiment of the present invention.

FIG. 19 is a further alternative embodiment of the present invention for monocycle generation using two first order differentiators. The circuit of FIG. 19 comprises a signal source 76 connected to the anode of an SRD 80. The cathode of the SRD 80 is connected to a resistor 88 which provides a DC return path to ground. The cathode of the SRD 80 is also connected to the input of a lumped capacitor 118, the output of the lumped capacitor 118 being connected to a first terminal of a resistor 120. The other terminal of the resistor 120 is connected to ground. The output of the capacitor 118 is connected to the input of a further capacitor 122. The output of the further capacitor 122 is connected to a first terminal of a load resistor 100, the other terminal of the load resistor 100 being connected to ground.

Figure 20:
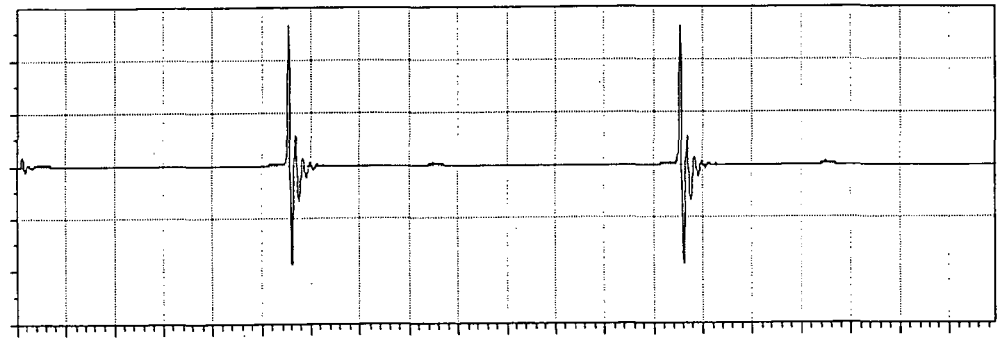
FIG. 20 is a simulated waveform showing output pulses produced by the circuit of FIG. 19.

The circuit of FIG. 19 was simulated using Agilent Technologies' ADS. The simulated result is shown in FIG. 20. The SRD 80 generates a sharp voltage transition and this is differentiated by the first differentiator comprising the capacitor 118 and the resistor 120 to produce the impulse and by the second differentiator comprising the capacitor 122 and the resistor 100 to produce a monocycle.

Figure 21:
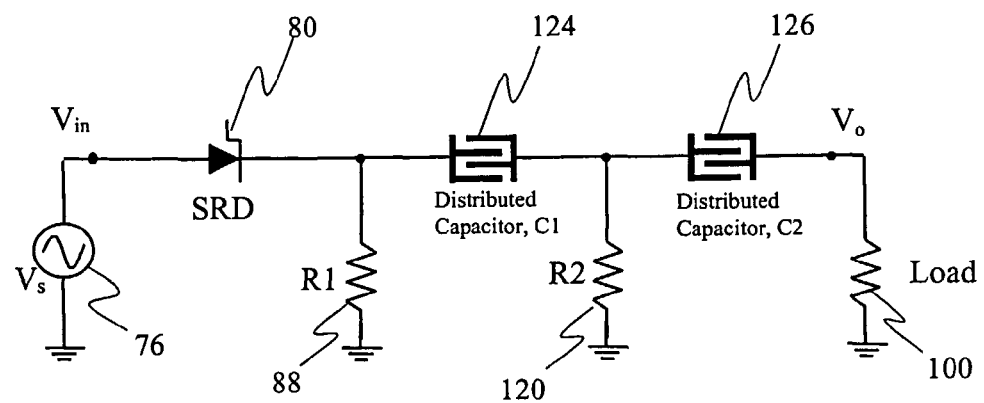
FIG. 21 is a circuit diagram of a system for producing monocycles according to a sixth embodiment of the present invention.

A further preferred embodiment of the invention is shown in FIG. 21. In this embodiment, two first order differentiators are used but the lumped capacitors 118 and 122 of the circuit of FIG. 19 are replaced by distributed capacitors 124 and 126.

The circuit of FIG. 21 comprises a signal source 76 connected to the anode of an SRD 80, the cathode of the SRD 80 being connected to a resistor 88 which provides a DC return to ground. The cathode of the SRD 80 is further connected to the input of a distributed capacitor 124, the output of the capacitor 124 being connected to a first terminal of a resistor 120. The second terminal of the resistor 120 is connected to ground. The output of the capacitor 124 is connected to the input of a further distributed capacitor 126. The output of the distributed capacitor 126 is connected to a first terminal of a load resistor 100, the second terminal of the load resistor 100 being connected to ground.

The SRD 80 generates a sharp voltage transition which is doubly differentiated by the resistor-capacitor (R-C) networks formed by capacitor 124 and resistor 120, and capacitor 126 and resistor 100 to produce a monocycle at the output.

Figure 22:
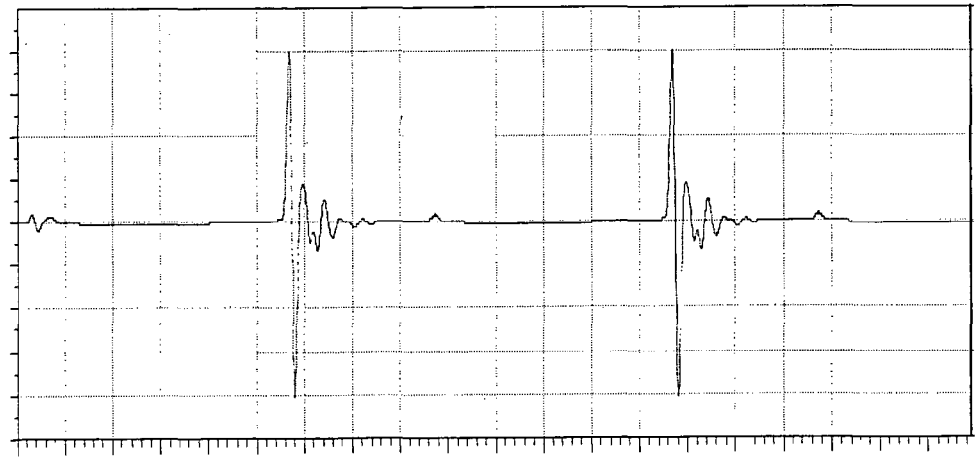
FIG. 22 is a simulated waveform showing output pulses produced by the circuit of FIG. 21.

The circuit of FIG. 21 was simulated using Agilent Technologies' ADS. The simulated result is shown in FIG. 22. The simulated pulse width was about 250 ps and the pulse repetition frequency was 250 MHz.

Figure 23:
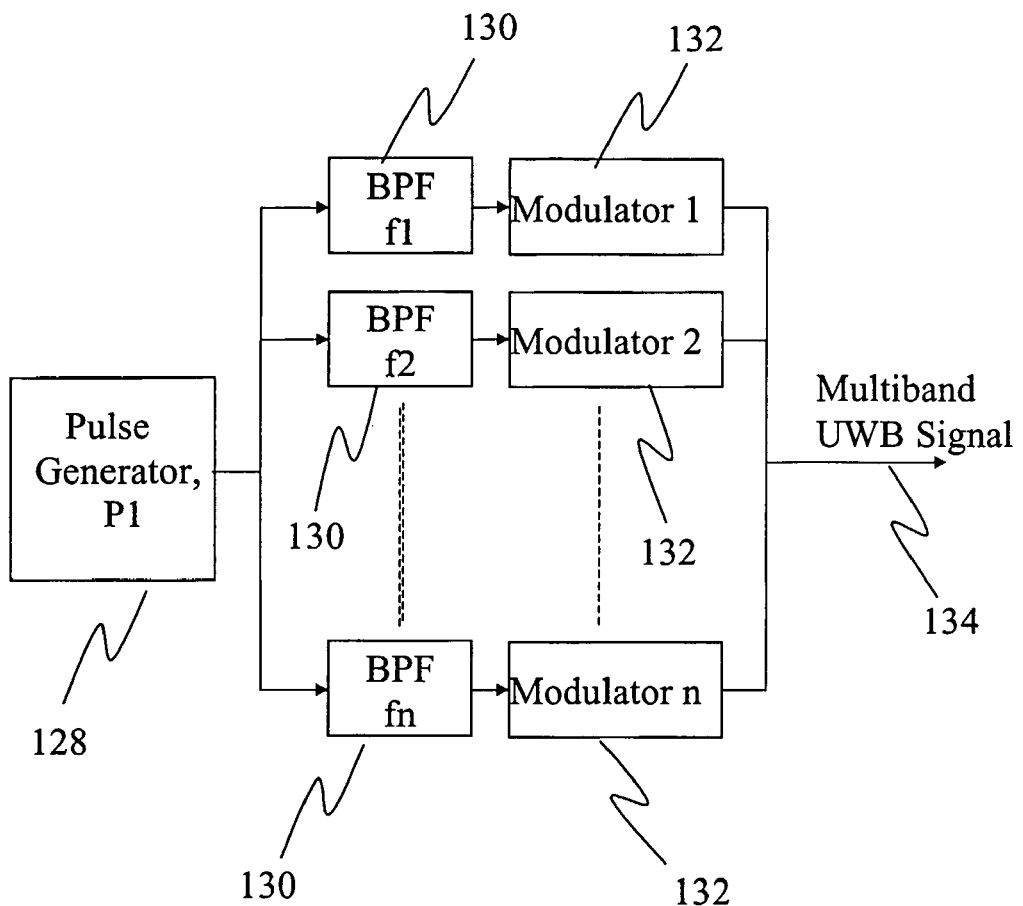
FIG. 23 is a schematic circuit diagram of a system for producing monocycles according to a seventh embodiment of the present invention.

FIG. 23 is a schematic of a system for multi-band operation which may include any of the pulse generator systems shown in the circuits of FIGS. 7, 10, 13, 17, 19 and 21. In the embodiment of FIG. 23, a pulse generator system 128 according to any of the embodiments shown in the circuits of FIGS. 7, 10, 13, 17, 19 and 21 is connected to a number (1 to n) of band pass filters 130 and the output of each band pass filter 130 is connected to the input of a respective modulator 132. The outputs of the modulators 132 are combined to produce a multi-band ultra wideband signal 134. The output of the pulse generator 128 is a monocycle which covers the frequency band defined by the band pass filters 130. The output may therefore be de-multiplexed in the frequency domain using the band pass filters 130. Each of the de-multiplexed signals may be modulated in a respective modulator 132 to produce a range of modulated signals in different wavebands which may be combined to produce the multi-band ultra wideband signal output 134.

The input signal source 76 from which the monocycles are to be generated using the circuits of FIGS. 7, 10, 13, 17, 19 and 21 may be, for example, a sinusoidal waveform, a square wave, a pulse or any other bi-polar signal.

The systems and methods according to the present invention may be particularly useful in the production of devices for use, for example, in the fields of communications, radar, ranging, imaging, depth measurement, and position locating.

Various modifications to the embodiments of the present invention described above may be made. For example, other components, materials and method steps can be added or substituted for those described above. Thus, although the invention has been described using particular embodiments, many variations are possible within the scope of the claims, as will be clear to the skilled reader, without departing from the spirit and scope of the invention.

The invention claimed is:

1. An apparatus for generating a monocycle comprising:
an input signal source for providing an input signal;
a step recovery diode (SRD) to receive said input signal and produce an impulse, said step recovery diode having an input and an output; and
one or more differentiators arranged to double differentiate said impulse to produce a monocycle; wherein
said one or more differentiators comprise a shunt inductor for providing a first differentiator and a capacitor connectable in series to the output of the step recovery diode for providing a second differentiator, said capacitor having an input and an output, said shunt inductor having an input and an output, and wherein said first and second differentiators are arranged to double differentiate said impulse to produce a monocycle.

2. An apparatus according to claim 1, wherein said input signal source comprises a source of a bi-polar signal.

3. An apparatus according to claim 2, wherein said bi-polar signal comprises any one of a sine wave, a square wave, or a pulse.

4. An apparatus according to claim 1, wherein said shunt inductor comprises a short circuited transmission line.

5. An apparatus according to claim 4, further comprising a second transmission line coupled between said input signal source and said step recovery diode.

6. An apparatus according to claim 5, wherein said transmission line is formed from a distributed microstrip element.

7. An apparatus according to claim 1, wherein said shunt inductor comprises a lumped inductor.

8. An apparatus according to claim 1, wherein said capacitor comprises a lumped capacitor or a distributed capacitor.

9. An apparatus according to claim 1, further comprising a resistor couplable to the output of said capacitor for providing a load, said resistor being arranged to form said first differentiator with said shunt inductor and to form said second differentiator with said capacitor.

10. An apparatus according to claim 1, wherein said shunt inductor is couplable to the output of said step recovery diode.

11. An apparatus according to claim 10, wherein said shunt inductor is arranged to provide a DC path for said step recovery diode.

12. An apparatus according to claim 10, wherein said shunt inductor, said capacitor and one or more coupling elements between said shunt inductor and said capacitor are formed from one or more distributed microstrip elements.

13. An apparatus according to claim 1, wherein said shunt inductor is couplable to the output of said capacitor.

14. An apparatus according to claim 13, further comprising a matching resistor couplable to said output of said step recovery diode, said resistor being arranged to provide a DC path for said step recovery diode, said output of said step recovery diode being couplable to said input of said capacitor, and said output of said capacitor being couplable to said shunt inductor and to a load resistor.

15. An apparatus according to claim 14, wherein said matching resistor comprises a discrete component.

16. An apparatus according to any one of claims 14 or 15, further comprising a transmission line couplable between said input signal source and said step recovery diode.

17. An apparatus according to claim 1, wherein the capacitor and/or the shunt inductor comprise one or more lumped components.

18. An apparatus according to claim 1, wherein the one or more differentiators comprise two or more R-C networks.

19. An apparatus according to claim 1, wherein said shunt inductor is a distributed inductor.

20. An apparatus according to claim 1, wherein said output of said step recovery diode (SRD) is connected to said shunt inductor, and wherein said shunt inductor comprises a lumped or a distributed inductor, said output of said step recovery diode (SRD) also being connected to the input of said capacitor.

21. An apparatus according to claim 1, wherein said shunt inductor of said first differentiator comprises a lumped or distributed inductor connected to the output of said step recovery diode (SRD) and to ground.

22. An apparatus according to claim 21, wherein said capacitor of said second differentiator comprises a lumped or distributed capacitor connected between the output of said step recovery diode (SRD) and a load.

23. An apparatus according to claim 1, wherein said first and/or said second differentiators comprise two or more cascaded resistor-capacitor networks.

24. An apparatus according to claim 23, wherein one or more of said one or more cascaded resistor-capacitor networks comprise lumped and/or distributed elements.

25. An apparatus according to claim 23, wherein one or other of said first and said second differentiators is connected to the output of said step recovery diode (SRD).

26. An apparatus according to claim 23, wherein said first differentiator has an output, and wherein said second differentiator is connected to the output of said first differentiator.

27. An apparatus according to claim 1, wherein said input of said capacitor is connected to said output of said step recovery diode (SRD) and said output of said capacitor is connected to said input of said shunt inductor and to a load.

28. An Ultra Wideband system comprising the apparatus of claim 1.

29. A system for producing multi-band signals comprising the apparatus according to claim 1, the apparatus having an output, the system further comprising one or more band pass filters having associated inputs and outputs, wherein the output of the apparatus is connected to the inputs of said one or more band pass filters, said system further comprising one or more modulators, each modulator having an associated output, said one or more modulators being arranged to modulate the outputs of the band pass filters, and said one or more modulators being arranged such that said outputs of said one or more modulators are combined to produce a multi-band ultra-wide band signal.

30. A system according to claim 29, wherein said one or modulators are arranged such that the outputs of said one or more band pass filters are individually modulated in said one or more modulators.

31. A method for generating a monocycle comprising:
providing an input signal from an input signal source to a step recovery diode;
producing an impulse using said step recovery diode;
differentiating said impulse twice to produce a monocycle wherein the step of differentiating said impulse twice comprises differentiating said impulse once with a shunt inductor and once with a capacitor, to produce said monocycle and said capacitor has an output, the method further comprising:
coupling a resistor to the output of said capacitor for providing a load,
forming a first differentiator from said shunt inductor, and forming a second differentiator from said capacitor.

32. A method according to claim 31, wherein the step of providing an input signal comprises providing a bi-polar signal.

33. A method according to claim 32, wherein the step of providing an input signal comprises providing any one of a sine wave signal, a square wave signal or a pulse.

34. A method according to claim 31, wherein the step of differentiating said impulse with a shunt inductor comprises differentiating said impulse with a short circuited transmission line.

35. A method according to claim 34, wherein said capacitor has an output, the method further comprising coupling a resistor to the output of said capacitor for providing a load, forming a first differentiator from said shunt inductor, and forming a second differentiator from said capacitor.

36. A method according to claim 31, wherein said step recovery diode has an output, the method further comprising coupling said shunt inductor to the output of said step recovery diode.

37. A method according to claim 36, further comprising arranging said shunt inductor to provide a DC path for said step recovery diode.

38. A method according to claim 37, further comprising forming said shunt inductor, said capacitor and one or more coupling elements between said shunt inductor and said capacitor from one or more distributed microstrip elements.

39. A method according to claim 36, further comprising coupling a transmission line between said input signal source and said step recovery diode.

40. A method according to claim 39, further comprising forming said transmission line from one or more distributed microstrip elements.

41. A method according to claim 31, further comprising coupling said shunt inductor to the output of said capacitor.

42. A method according to claim 41, further comprising coupling a matching resistor to said output of said step recovery diode to provide a DC path for said step recovery diode, coupling said input of said step recovery diode to said input of said capacitor, and coupling said output of said capacitor to said shunt inductor and to a load resistor.

43. A method according to claim 42, comprising forming said matching resistor as a discrete component.

44. A method according to claim 42, further comprising coupling a transmission line between said input signal source and said step recovery diode.

45. A method for producing multi-band signals comprising:
 (a) generating a monocycle by:
  (i) providing an input signal from an input signal source to a step recovery diode;
  (ii) producing an impulse using said step recovery diode; and
  (iii) differentiating said impulse twice to produce a monocycle;
 (b) applying said monocycle as an input to one or more band pass filters, said one or more band pass filters having one or more outputs;
 (c) modulating said one or more outputs of said one or more band pass filters using one or more modulators to produce a multi-band ultra-wide band signal comprising one or more modulated output signals.

\* \* \* \* \*